(12) United States Patent
Minoshima et al.

(10) Patent No.: US 10,985,037 B2
(45) Date of Patent: Apr. 20, 2021

(54) SUBSTRATE CLEANING APPARATUS, SUBSTRATE CLEANING METHOD, AND CONTROL METHOD OF SUBSTRATE CLEANING APPARATUS

(71) Applicant: EBARA CORPORATION, Tokyo (JP)

(72) Inventors: Daisuke Minoshima, Tokyo (JP); Masayoshi Imai, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 15 days.

(21) Appl. No.: 15/944,654

(22) Filed: Apr. 3, 2018

(65) Prior Publication Data

US 2018/0294171 A1    Oct. 11, 2018

(30) Foreign Application Priority Data

Apr. 5, 2017  (JP) .............................. JP2017-075076

(51) Int. Cl.
| | | |
|---|---|---|
| *H01L 21/67* | (2006.01) | |
| *B08B 3/02* | (2006.01) | |
| *H01L 21/687* | (2006.01) | |

(52) U.S. Cl.
CPC ........ *H01L 21/67051* (2013.01); *B08B 3/024* (2013.01); *H01L 21/67046* (2013.01); *H01L 21/68728* (2013.01)

(58) Field of Classification Search
None
See application file for complete search history.

(56) References Cited

U.S. PATENT DOCUMENTS

| | | | | |
|---|---|---|---|---|
| 2014/0158159 A1* | 6/2014 | Ishibashi | ........... | H01L 21/67051 134/6 |
| 2015/0034121 A1* | 2/2015 | Ishibashi | ........... | H01L 21/67046 134/6 |
| 2015/0348806 A1* | 12/2015 | Ishibashi | ........... | H01L 21/67046 134/33 |
| 2018/0068877 A1* | 3/2018 | Ishibashi | ........... | H01L 21/68728 |

FOREIGN PATENT DOCUMENTS

| | | |
|---|---|---|
| JP | 2015-015284 A | 1/2015 |
| JP | 2015-201627 A | 11/2015 |
| JP | 2016-009768 A | 1/2016 |

OTHER PUBLICATIONS

Japan Patent Application No. 2017-075076; Notice of Reasons for Refusal; dated Aug. 18, 2020; 13 pages.

* cited by examiner

*Primary Examiner* — Michael E Barr
*Assistant Examiner* — Jason P Riggleman
(74) *Attorney, Agent, or Firm* — BakerHostetler

(57) ABSTRACT

Various examples regarding substrate cleaning apparatus and methods, and related apparatus and method are disclosed. According to one embodiment, provided is a substrate cleaning apparatus including: a substrate holding and rotating module; an elongated cleaning member configured to come into contact with the substrate while the substrate is held and rotated by the substrate holding and rotating module; and a first nozzle and a second nozzle, both of which are arranged on an identical side with respect to a longitudinal direction of the cleaning member, wherein the first nozzle is operably adjusted to supply liquid more forcefully than liquid from the second nozzle, and the first nozzle is arranged so that the liquid from the first nozzle is reached to a first area located closer to the first nozzle than the cleaning member in the substrate.

8 Claims, 7 Drawing Sheets

307

SUBSTRATE CLEANING APPARATUS, SUBSTRATE CLEANING METHOD, AND CONTROL METHOD OF SUBSTRATE CLEANING APPARATUS

CROSS-REFERENCE TO RELATED APPLICATIONS

This application claims the benefit of Japanese Priority Patent Application JP 2017-075076 filed on Apr. 5, 2017, the entire contents of which are incorporated herein by reference.

FIELD

The present disclosure relates to a substrate cleaning apparatus and a substrate cleaning method for cleaning a substrate while supplying liquid, and a control method of such a substrate cleaning apparatus.

BACKGROUND AND SUMMARY

A technique of cleaning a substrate with a roll sponge while supplying liquid is known. A spraying nozzle and a single-pipe nozzle are used as a nozzle that supplies liquid. The single-pipe nozzle can supply liquid to only a small area, so that the spraying nozzle is useful for supplying liquid to a large area.

However, upon advancement of related technologies, the spraying nozzle has a relatively poor performance of discharging liquid that has been used for the cleaning to the outside of the substrate in terms of developing latest technology, so that liquid or foreign objects may be detected as a remain on the substrate after the cleaning. Therefore, there is a problem that the cleaning performance of the substrate degrades.

It is desired to provide a substrate cleaning apparatus and a substrate cleaning method having a high cleaning performance, and a control method of such a substrate cleaning apparatus.

According to one embodiment, provided is a substrate cleaning apparatus including: a substrate holding and rotating module; an elongated cleaning member configured to come into contact with the substrate while the substrate is held and rotated by the substrate holding and rotating module; and a first nozzle and a second nozzle, both of which are arranged on an identical side with respect to a longitudinal direction of the cleaning member, wherein the first nozzle is operably adjusted to supply liquid more forcefully than liquid from the second nozzle, and the first nozzle is arranged so that the liquid from the first nozzle is reached to a first area located closer to the first nozzle than the cleaning member in the substrate, and the second nozzle is operably adjusted to supply liquid to a second area in the substrate, which is larger than the first area, wherein the arrangement of second nozzle is located closer to the second nozzle than the cleaning member in the substrate, and located so that the second area includes at least an area outside a circumferential edge of the substrate.

According to another embodiment, provided is a substrate cleaning method including: holding and rotating a substrate; contacting an elongated cleaning member with the substrate; and supplying liquid from a first nozzle to a first area in the substrate and supplying liquid from a second nozzle to a second area in the substrate while contacting the elongated cleaning member with the substrate, thereby cleaning the substrate, wherein the first area and the second area are arranged on an identical side with respect to a longitudinal direction of the cleaning member, the second area is larger than the first area, and the first nozzle supplies liquid more forcefully than the second nozzle.

According to another embodiment, provided is a method of controlling a substrate cleaning apparatus, the method including: holding and rotating a substrate; contacting an elongated cleaning member with the substrate; and supplying liquid from a first nozzle to a first area in the substrate and supplying liquid from a second nozzle to a second area in the substrate while contacting the elongated cleaning member with the substrate, thereby cleaning the substrate, wherein the first area and the second area are arranged on an identical side with respect to a longitudinal direction of the cleaning member, the second area is larger than the first area, and the first nozzle supplies liquid more forcefully than the second nozzle.

DETAILED DESCRIPTION OF NON-LIMITING EXAMPLE EMBODIMENTS

Figure 1:
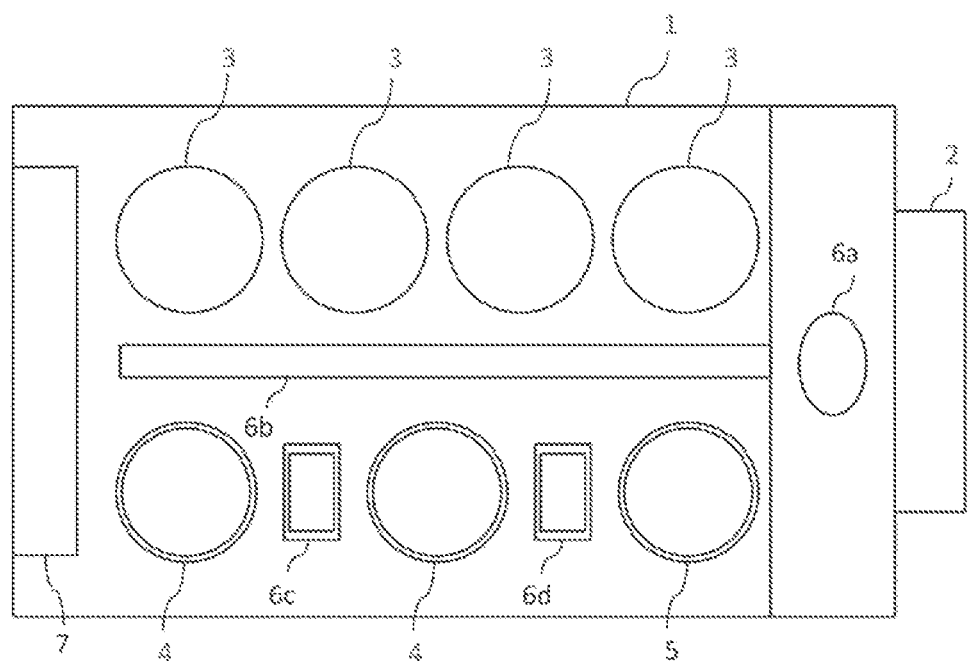
FIG. 1 is a schematic top view of a substrate processing apparatus according to an embodiment.

According to one embodiment, provided is a substrate cleaning apparatus including: a substrate holding and rotating module; an elongated cleaning member configured to come into contact with the substrate while the substrate is held and rotated by the substrate holding and rotating module; and a first nozzle and a second nozzle, both of which are arranged on an identical side with respect to a longitudinal direction of the cleaning member, wherein the first nozzle is operably adjusted to supply liquid more forcefully than liquid from the second nozzle, and the first nozzle is arranged so that the liquid from the first nozzle is reached to a first area located closer to the first nozzle than the cleaning member in the substrate, and the second nozzle is operably adjusted to supply liquid to a second area in the substrate, which is larger than the first area, wherein the arrangement of second nozzle is located closer to the second nozzle than the cleaning member in the substrate, and located so that the second area includes at least an area outside a circumferential edge of the substrate.

The liquid is forcefully supplied from the first nozzle, so that the liquid that has been used for the cleaning can be efficiently discharged from the substrate, and thereby detergency is improved.

The first nozzle may be a single-pipe nozzle and the second nozzle is a spray-type nozzle. The cleaning member may be roll type sponge.

The first nozzle and the second nozzle may be arranged so that the first area is close to a center of the substrate, and at least a part of one end of the second area is superposed with at least a part of the first area and another end extends to an edge of the substrate.

It is possible to efficiently discharge the liquid that has been used for the cleaning by setting the first area and the second area in this way.

The first nozzle and the second nozzle may be arranged so that the first area is close to a center of the substrate, and at least a part of one end of the second area may be superposed with at least a part of the first area and another end extends to an edge of the substrate.

Thereby, a liquid film is protected, and the liquid supplied from the second nozzle is not prevented from flowing to the outside of the substrate.

The first area and the second area may be located in an area after the rotating substrate comes into contact with the cleaning member.

A direction of a liquid line from the second nozzle to the substrate may not be opposite to a rotation direction of the substrate.

A direction of the liquid line from the second nozzle to the substrate may be coincident with a rotation direction of the cleaning member at a position where the cleaning member and the substrate come into contact with each other.

The first nozzle may be connected to a pipe from a liquid supply source through the attachment, and a diameter of a hole of the attachment through which liquid passes may be smaller than a diameter of the pipe.

Thereby, it is possible to increase the force of the liquid supplied from the first nozzle.

According to another embodiment, provided is a substrate cleaning method including: holding and rotating a substrate; contacting an elongated cleaning member with the substrate; and supplying liquid from a first nozzle to a first area in the substrate and supplying liquid from a second nozzle to a second area in the substrate while contacting the elongated cleaning member with the substrate, thereby cleaning the substrate, wherein the first area and the second area are arranged on an identical side with respect to a longitudinal direction of the cleaning member, the second area is larger than the first area, and the first nozzle supplies liquid more forcefully than the second nozzle.

According to another embodiment, provided is a method of controlling a substrate cleaning apparatus, the method including: holding and rotating a substrate; contacting an elongated cleaning member with the substrate; and supplying liquid from a first nozzle to a first area in the substrate and supplying liquid from a second nozzle to a second area in the substrate while contacting the elongated cleaning member with the substrate, thereby cleaning the substrate, wherein the first area and the second area are arranged on an identical side with respect to a longitudinal direction of the cleaning member, the second area is larger than the first area, and the first nozzle supplies liquid more forcefully than the second nozzle.

Hereinafter, an embodiment will be specifically described with reference to the drawings.

FIG. 1 is a schematic top view of a substrate processing apparatus according to an embodiment. The substrate processing apparatus processes various substrates in a manufacturing process of a semiconductor wafer having a diameter of 300 mm or 450 mm, a flat panel, an image sensor such as complementary metal oxide semiconductor (CMOS) or charge coupled device (CCD), and a magnetic film of magnetoresistive random access memory (MRAM).

The substrate processing apparatus includes a housing 1 having a substantially rectangular shape, a load port 2 where a substrate cassette where a large number of substrates are stocked is mounted, one or a plurality (four in an aspect shown in FIG. 1) of substrate polishing apparatuses 3, one or a plurality (two in the aspect shown in FIG. 1) of substrate cleaning apparatuses 4, a substrate drying apparatus 5, transporting mechanisms 6a to 6d, and a controller 7.

The load port 2 is arranged adjacent to the housing 1. It is possible to mount an open cassette, a standard mechanical interface (SMIF) pod, or front opening unified pod (FOUP) on the load port 2. The SMIF pod and the FOUP are a sealed container that can maintain an environment independent from an external space by storing a substrate cassette inside thereof and covering the substrate cassette with a partition wall. Examples of the substrate include a semiconductor wafer and the like.

The substrate polishing apparatuses 3 that polish the substrate, the substrate cleaning apparatuses 4 that clean the substrate that has been polished, and the substrate drying apparatus 5 that dries the substrate that has been cleaned are housed in the housing 1. The substrate polishing apparatuses 3 are arranged along a longitudinal direction of the substrate processing apparatus, and the substrate cleaning apparatuses 4 and the substrate drying apparatus 5 are also arranged along the longitudinal direction of the substrate processing apparatus.

The transporting mechanism 6a is arranged in an area surrounded by the load port 2, and the substrate polishing apparatus 3 and the substrate drying apparatus 5 which are located close to the load port 2. The transporting mechanism 6b is arranged in parallel with the substrate polishing apparatuses 3 and in parallel with the substrate cleaning apparatuses 4 and the substrate drying apparatus 5. The transporting mechanism 6a receives a substrate that has not yet been polished from the load port 2 and transfers the substrate to the transporting mechanism 6b, and receives a substrate, which has been dried and taken out from the substrate drying apparatus 5, from the transporting mechanism 6b.

The transporting mechanism 6c that transfers a substrate between the two substrate cleaning apparatuses 4 is arranged between the substrate cleaning apparatuses 4. The transporting mechanism 6d that transfers a substrate between the substrate cleaning apparatus 4 and the substrate drying apparatus 5 is arranged between the substrate cleaning apparatus 4 and the substrate drying apparatus 5.

Further, the controller 7 that controls operations of each device in the substrate processing apparatus is arranged inside the housing 1. The present embodiment is described by using an aspect where the controller 7 is arranged inside the housing 1. However, it is not limited to this, and the controller 7 may be arranged outside the housing 1.

Figure 2:
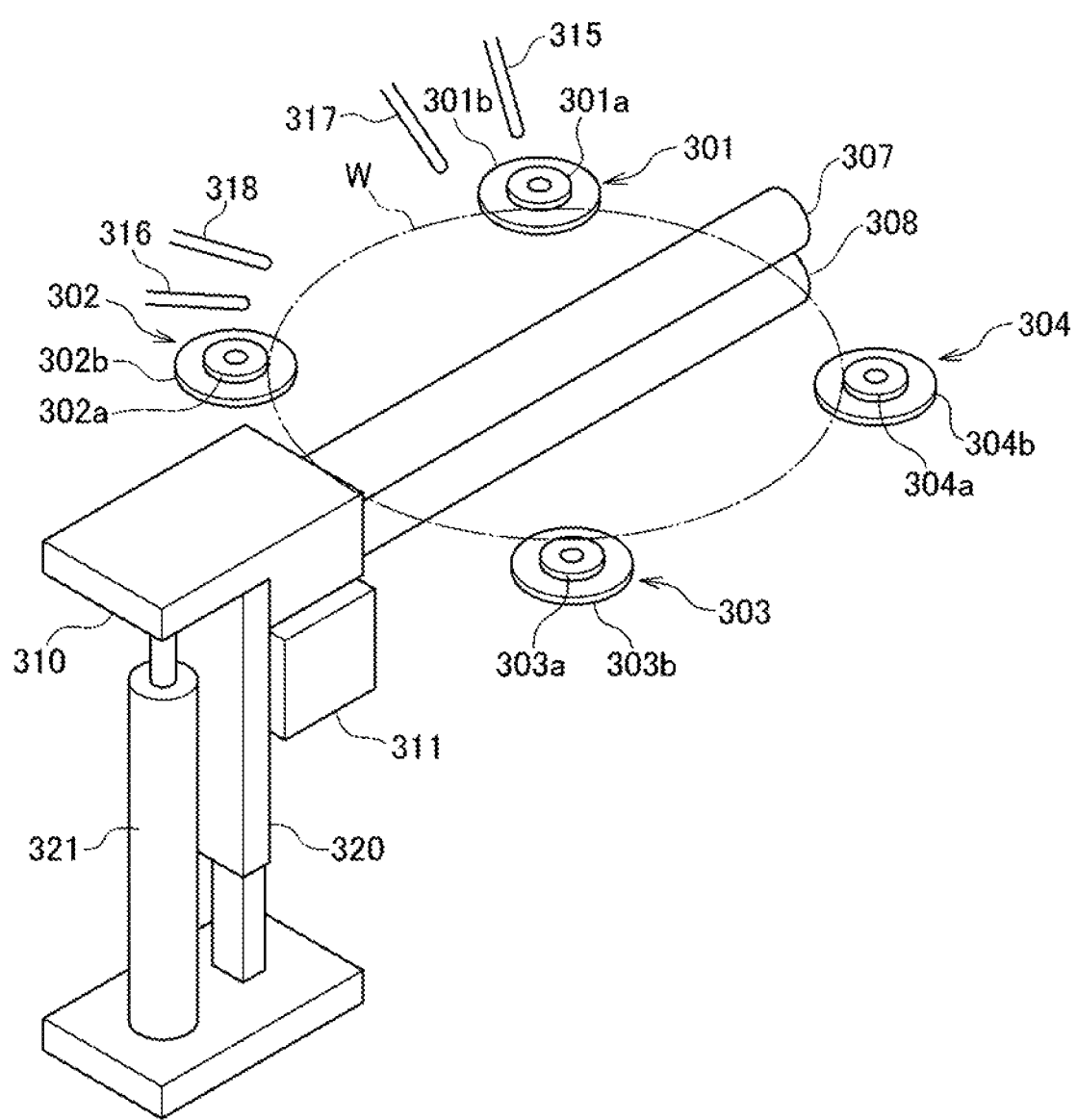
FIG. 2 is a perspective view schematically showing a substrate cleaning apparatus.

FIG. 2 is a perspective view schematically showing the substrate cleaning apparatus 4. The substrate cleaning apparatus 4 includes four rollers 301 to 304 (substrate holding and rotating modules) that approximately horizontally hold a substrate W and rotate the substrate W, roll sponges 307 and 308 (in other words, cleaning members) that come into contact with upper and lower surfaces of the substrate W and clean the substrate W, rotating mechanisms 310 and 311 that rotate the roll sponges 307 and 308, cleaning liquid supply nozzles 315 and 316 that supply cleaning liquid (for example, DIW or pure water) to the upper and lower surfaces of the substrate W, and chemical liquid supply nozzles 317 and 318 that supply chemical liquid to the upper and lower surfaces of the substrate W.

The roller 301 has a two-step configuration including a holding module 301a and a shoulder module (in other words, support module) 301b. The diameter of the shoulder module 301b is greater than that of the holding module 301a, and the holding module 301a is formed on the shoulder module 301b. The rollers 302 to 304 have the same configuration as that of the roller 301. The rollers 301 to 304 can be moved closer to and away from each other by a drive mechanism (for example, air cylinder) not shown in the drawings. At least one of the rollers 301 to 304 is rotationally driven by a rotating mechanism not shown in the drawings.

The rotating mechanism 310 that rotates the upper roll sponge 307 is attached to a guide rail 320 that guides a vertical movement of the upper roll sponge 307. The rotating mechanism 310 is supported by an elevation drive mechanism 321, and the rotating mechanism 310 and the upper roll sponge 307 are moved in a vertical direction by the elevation drive mechanism 321.

Although not shown in the drawings, the rotating mechanism 311 that rotates the lower roll sponge 308 is also supported by the guide rail, and the rotating mechanism 311 and the lower roll sponge 308 are vertically moved by an elevation drive mechanism. As the elevation drive mechanism, for example, a motor drive mechanism using a ball screw, or an air cylinder is used.

Figure 2A:
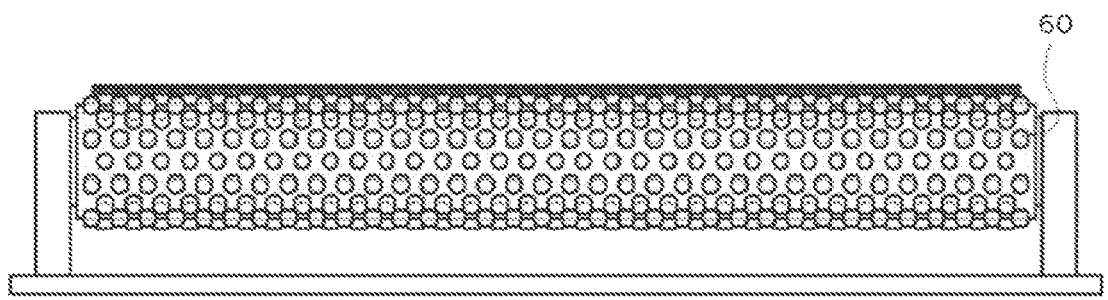
FIG. 2A is a side view of a roll sponge.

FIG. 2A is a side view of the roll sponge 307. As shown in FIG. 2A, a plurality of protruded portions 60 are provided on a surface of the roll sponge 307. The roll sponge 307 is formed of a porous polymer material such as polyvinyl alcohol (PVA).

Followings are the description based on FIG. 2. The roll sponges 307 and 308 are separated from each other when the substrate W is inserted or pulled out. When cleaning the substrate W, the roll sponges 307 and 308 are moved in a direction to be close to each other and come into contact with the upper and the lower surfaces of the substrate W. Forces by which the roll sponges 307 and 308 press the upper and the lower surfaces of the substrate W are adjusted by the elevation drive mechanism 321 and an elevation drive mechanism not shown in the drawings, respectively. The upper roll sponge 307 and the rotating mechanism 310 are supported from below by the elevation drive mechanism 321, so that the force which the upper roll sponge 307 applies to the upper surface of the substrate W can be adjusted from 0 [N].

The substrate W transported by the transporting mechanism 6b is first mounted on the shoulder modules 301b to 304b of the rollers 301 to 304 and thereafter the rollers 301 to 304 move to the substrate W, so that the substrate W is held by the holding modules 301a to 304a. At least one of the rollers 301 to 304 is rotationally driven, so that the substrate W rotates in a state in which an outer circumferential portion of the substrate W is held by the rollers 301 to 304.

On the other hand, when the transported substrate W is held by the rollers 301 to 304, the upper roll sponge 307 falls and the lower roll sponge 308 rises, so that the upper roll sponge 307 and the lower roll sponge 308 come into contact with the upper surface and the lower surface of the substrate W, respectively. Then, the roll sponges 307 and 308 are rotationally driven by the rotating mechanisms 310 and 311. Thereby, the roll sponges 307 and 308 are rotated while being in contact with the upper and the lower surfaces of the substrate W.

In this way, in a state in which the substrate W and the roll sponges 307 and 308 are rotating, the cleaning liquid is supplied from the cleaning liquid supply nozzles 315 and 316 and the chemical liquid is supplied from the chemical liquid supply nozzles 317 and 318. Thereby, the substrate W is cleaned. The chemical liquid is a chemical liquid such as ammonia, which is generally used for cleaning in a substrate processing apparatus. The cleaning liquid and the chemical liquid may be collectively and simply called liquid.

One of features of the present embodiment is a liquid supply form from the cleaning liquid supply nozzles 315 and 316 and the chemical liquid supply nozzles 317 and 318, and the liquid supply form will be described in detail.

Figure 3:
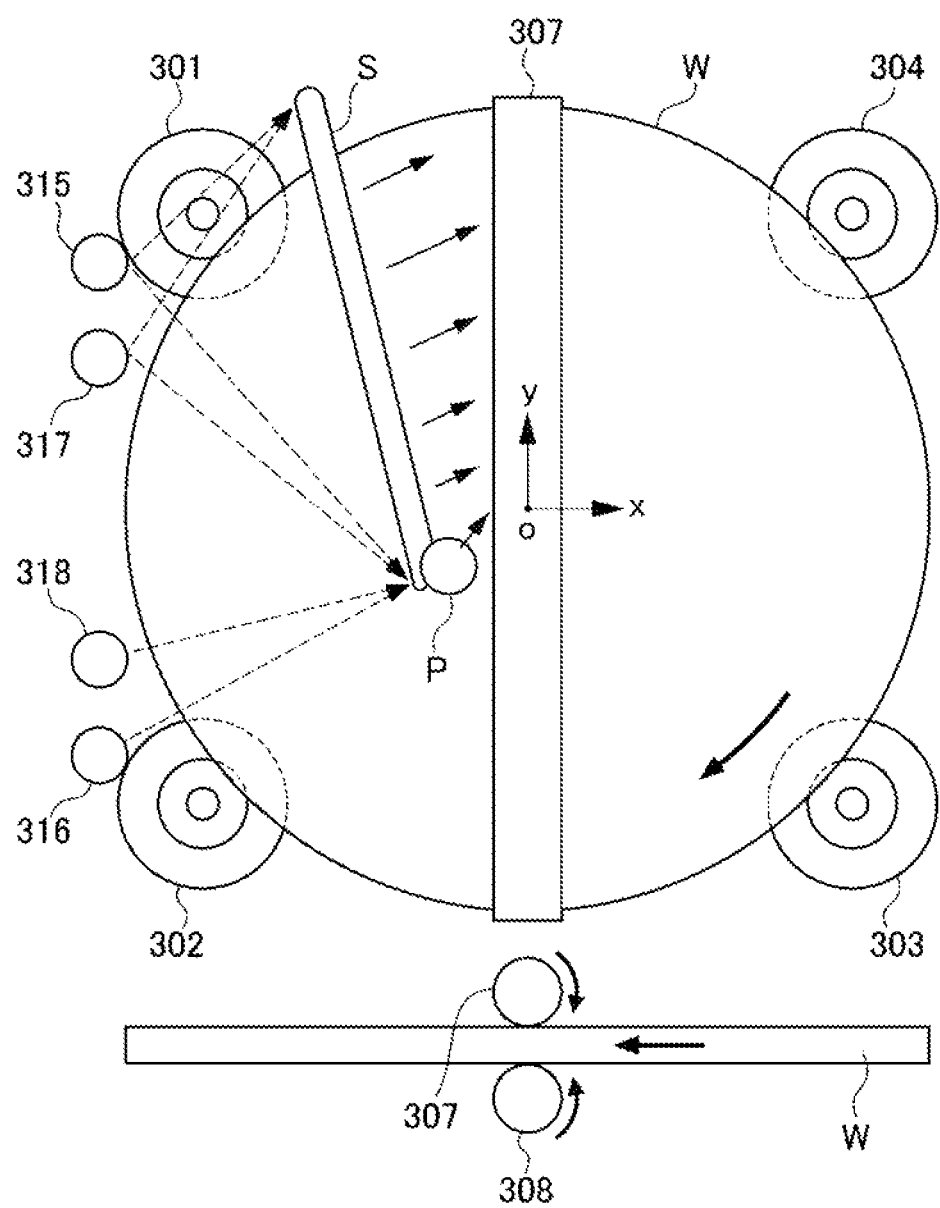
FIG. 3 is a diagram schematically showing a substrate, roll sponges, cleaning liquid supply nozzles, and chemical liquid supply nozzles.

FIG. 3 is a diagram schematically showing the substrate W, the roll sponges 307 and 308, the cleaning liquid supply nozzles 315 and 316, and the chemical liquid supply nozzles 317 and 318. FIG. 3 includes a diagram viewed from above and a diagram viewed from side. Hereinafter, it is assumed that the substrate W rotates clockwise when viewed from above and the roll sponge 307 rotates clockwise when viewed from side. It is assumed that the roll sponge 308 rotates counterclockwise.

Further, a coordinate system is defined where the center of the substrate W is the origin, a direction in which the roll sponge 307 extends is y axis (above in FIG. 3 is defined as positive), and a direction perpendicular to the y axis in a plane passing through the substrate W is x axis. The unit of the coordinates (x, y) is mm. The radius of the substrate W in the coordinate system is defined as 150 mm.

The roll sponge 307 has an elongated shape, is arranged to pass over the center of the substrate W, and has a length greater than or equal to the diameter of the substrate W. The same goes for the lower roll sponge 308.

The cleaning liquid supply nozzles 315 and 316 and the chemical liquid supply nozzles 317 and 318 are arranged in an area of x<0 (that is, the same side with respect to the longitudinal direction of the roll sponge 307). More specifically, the cleaning liquid supply nozzle 315 and the chemical liquid supply nozzle 317 are spray-type nozzles (second nozzles) and arranged in an area of x<0 and y>0. On the other hand, the cleaning liquid supply nozzle 316 and the chemical liquid supply nozzle 318 are pin-type nozzles (first nozzles) and arranged in an area of x<0 and y<0.

The spray-type nozzle is also called a spraying nozzle. A plurality of through-holes where liquid passes are formed in a front end of the spray-type nozzle, and liquid is supplied from the front end in a spreading mist form. On the other hand, the pin-type nozzle is also called a single-pipe nozzle, and liquid is forcefully supplied but hardly spread from a front end of the pin-type nozzle. Therefore, the liquid supplied from the spray-type nozzle reaches an area on the substrate W greater than an area on the substrate W to which the liquid supplied from the pin-type nozzle reaches. On the other hand, the liquid is supplied more forcefully from the pin-type nozzle than from the spray-type nozzle. In the present embodiment, the arrangement of the pin-type nozzles and the spray-type nozzles is optimized by utilizing features of each of the pin-type nozzle and the spray-type nozzle.

The pin-type nozzle may be a nozzle with an attachment inserting (connecting) to a pipe from a liquid supply source (not shown in the drawings). When a diameter of the attachment (for example, about 1 mm) is made smaller than a diameter of the pipe (for example, about 4 mm), it is possible to increase the force of the liquid supplied from the pin-type nozzle.

The cleaning liquid supply nozzle 316 and the chemical liquid supply nozzle 318, which are the pin-type nozzles, supply liquid in a direction toward the center of the substrate W. A liquid reaching area P is a vicinity on the upper surface of the substrate W, more specifically, an area on the front side of the center of the substrate W, for example, a small area with coordinates (−20, −20) as a center. It can be said that the liquid reaching area P is an area where the distance from the substrate W is smaller than a predetermined value. In an area near the center of the substrate W, effects of the rotation of the substrate W are small, so that the movement of the liquid is small. However, when the liquid is forcefully supplied from the pin-type nozzles, it is possible to actively move the liquid.

On the other hand, the cleaning liquid supply nozzle 315 and the chemical liquid supply nozzle 317, which are the spray-type nozzles, supply liquid toward an area of x<0 and y>0 of the substrate W so that the liquids do not move opposite to the rotation direction of the substrate W, and a liquid reaching area S is an area between a vicinity of the center and an edge of the upper surface of the substrate W, for example, an area near a line segment connecting coordinates (−20, −25) and (−60, 135). A supply of the liquids tends to be insufficient in an area far from the center of the substrate W, so that a sufficient amount of the liquids can be supplied from the spray-type nozzles.

As described above, the liquid reaching area P from the pin-type nozzles and the liquid reaching area S from the spray-type nozzles are located on the same side with respect to the longitudinal direction of the roll sponge 307 (on the side where the pin-type nozzles and the spray-type nozzles are arranged). In other words, the liquid reaching areas P and S are located in an area after the rotating substrate W comes into contact with the roll sponge 307. Further, at least a part of one end of the liquid reaching area S is superposed with at least a part of the liquid reaching area P. The other end of the liquid reaching area S extends to the edge of the substrate W.

Here, a longitudinal direction of the liquid reaching area S is not in parallel with the longitudinal direction of the roll sponge 307, and it is desirable that the closer to the edge of the substrate W, the farther the liquid reaching area S is away from the roll sponge 307. Further, it is desirable that a part of the liquids supplied from the spray-type nozzles runs off to the outside of the substrate W (that is, the liquid reaching area S includes outside of a circumferential edge portion of the substrate W).

The liquids supplied from the spray-type nozzles are moved from the wide liquid reaching area S to the roll sponge 307 by the rotation of the substrate W. The roll sponge 307 rotates in contact with the substrate W in a state in which the liquids are interposed between the roll sponge 307 and the substrate W, so that the substrate W is cleaned. The liquids that have been used for the cleaning pass through between the roll sponge 307 and the substrate W and reach an area of x>0. The liquids have been used for the cleaning, so that the liquids are contaminated or contain foreign objects.

On the other hand, the forceful liquids supplied from the pin-type nozzles move from the small liquid reaching area P, pass through between the roll sponge 307 and an approximate center of the substrate W, and reach the area of x>0 while maintaining the force to some extent. Then, the liquids from the spray-type nozzles, which have been used for the cleaning, are discharged to the outside of the substrate W by the force of the liquids from the pin-type nozzles.

By forcefully supplying the liquids from the pin-type nozzles to the center of the substrate W in this way, it is possible to efficiently discharge the liquids after the cleaning from the substrate W and prevent chemical liquid or foreign objects from remaining on the substrate W after the cleaning.

Further, the liquid reaching area S from the spray-type nozzles is not in parallel with the roll sponge 307, so that a liquid film is protected and the liquids supplied from the pin-type nozzles is not prevented from flowing to the outside of the substrate W. Specifically, if the liquid reaching area S is in parallel with the roll sponge 307, although the liquids near the edge of the substrate W are easily discharged to the outside by effects of the rotation of the substrate W, the liquids near the center of the substrate W, since the effect of the rotation of the substrate W is small, tend to take a long time to be discharged or tend to remain on the substrate W.

On the other hand, in the present embodiment, the liquid reaching area S is not in parallel with the roll sponge 307 (the liquid reaching area S is oblique toward the outside of the substrate W), so that all the liquids supplied from the spray-type nozzles flow toward the outside of the substrate W and a discharging performance is improved. In other words, the liquids supplied onto the substrate W can be discharged to the outside of the substrate W as soon as possible without being remained on the substrate, and the liquids on the substrate W can be refreshed.

Further, the amount of liquids from the spray-type nozzles in an end of the liquid reaching area tends to be insufficient. However, it is possible to secure a flow rate of the liquids even in an area near the edge of the substrate W by causing a part of the liquids from the spray-type nozzles to run off to the outside of the substrate W.

Further, it is possible to smoothly discharge the liquids to the outside of the substrate W by interlocking the liquids from the pin-type nozzles and the liquids from the spray-type nozzles by overlapping the liquid reaching area P from the pin-type nozzles and the liquid reaching area S from the spray-type nozzles without forming a gap between the liquid reaching area P from the pin-type nozzles and the liquid reaching area S from the spray-type nozzles.

Figure 4:
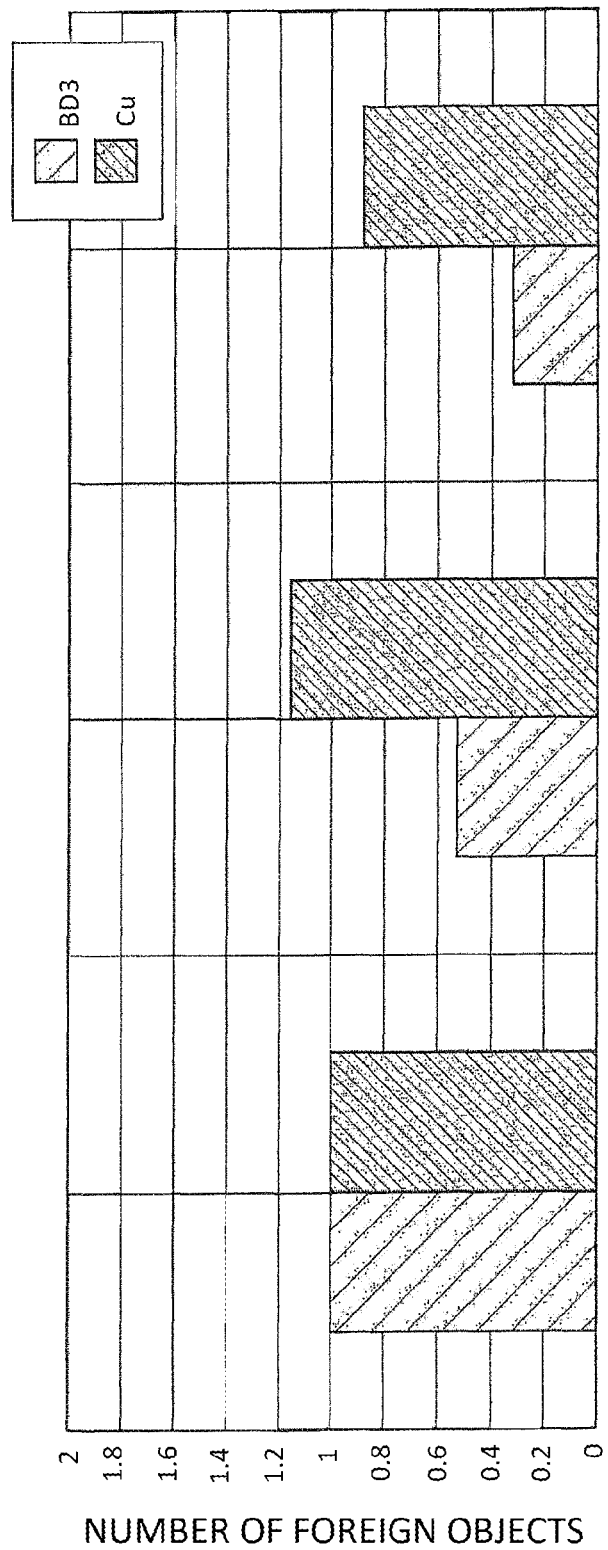
FIG. 4 is a diagram showing a result of an experiment performed to confirm effects of the embodiment.

FIG. 4 is a diagram showing a result of an experiment performed to confirm effects of the present embodiment. In the experiment, an experiment is carried out for each of a substrate (BD3) having a Low-K (low-dielectric constant) film and a substrate (Cu) having a copper film, and the number of defects remaining on the substrate W after the cleaning is counted for each substrate. In the case of the substrate (BD3) having a Low-K film, the number of defects greater than or equal to 100 nm is counted, and in the case of the substrate (Cu) having a copper film, the number of defects greater than or equal to 110 nm is counted.

A comparative example is an aspect where both the pin-type nozzles 316 and 318 in FIG. 3 are replaced with spray-type nozzles. Example 1 is an aspect shown in FIG. 3. Example 2 is an aspect where the rotation direction of the roll sponge 307 in FIG. 3 is counterclockwise and the rotation direction of the roll sponge 308 is clockwise. In other words, in Example 2, the rotation direction of the roll sponge 307 at a position where the roll sponge 307 is in contact with the substrate W is coincident with a liquid supply direction from the spray-type nozzles.

As known from FIG. 4, in Examples 1 and 2, the number of defects on the BD3 could be reduced to 50% and 30%, respectively, of that of the comparative example.

In this way, in the present embodiment, the liquid reaching areas P and S are optimized by using both the pin-type nozzles and the spray-type nozzles. Specifically, the liquids are supplied from the spray-type nozzles to a large area in a front side of the substrate W, and the liquids are forcefully supplied from the pin-type nozzles to a small area near the center of the substrate W. Thereby, the liquids after the cleaning are forcefully discharged to the outside of the substrate W, so that detergency is improved. When the nozzle arrangement described above is applied not only to the front surface (a surface where a pattern is formed) of the substrate W but also to the back surface, detergency is improved.

At least a part of an operation of the substrate cleaning apparatus 4 may be controlled by a control apparatus. Specifically, the control apparatus may hold and rotate the substrate W, cause the roll sponges 307 and 308 to clean the substrate W, and cause the pin-type nozzles and the spray-type nozzles to supply liquid. The control apparatus may control the substrate processing apparatus by executing a predetermined program.

Figure 5A:
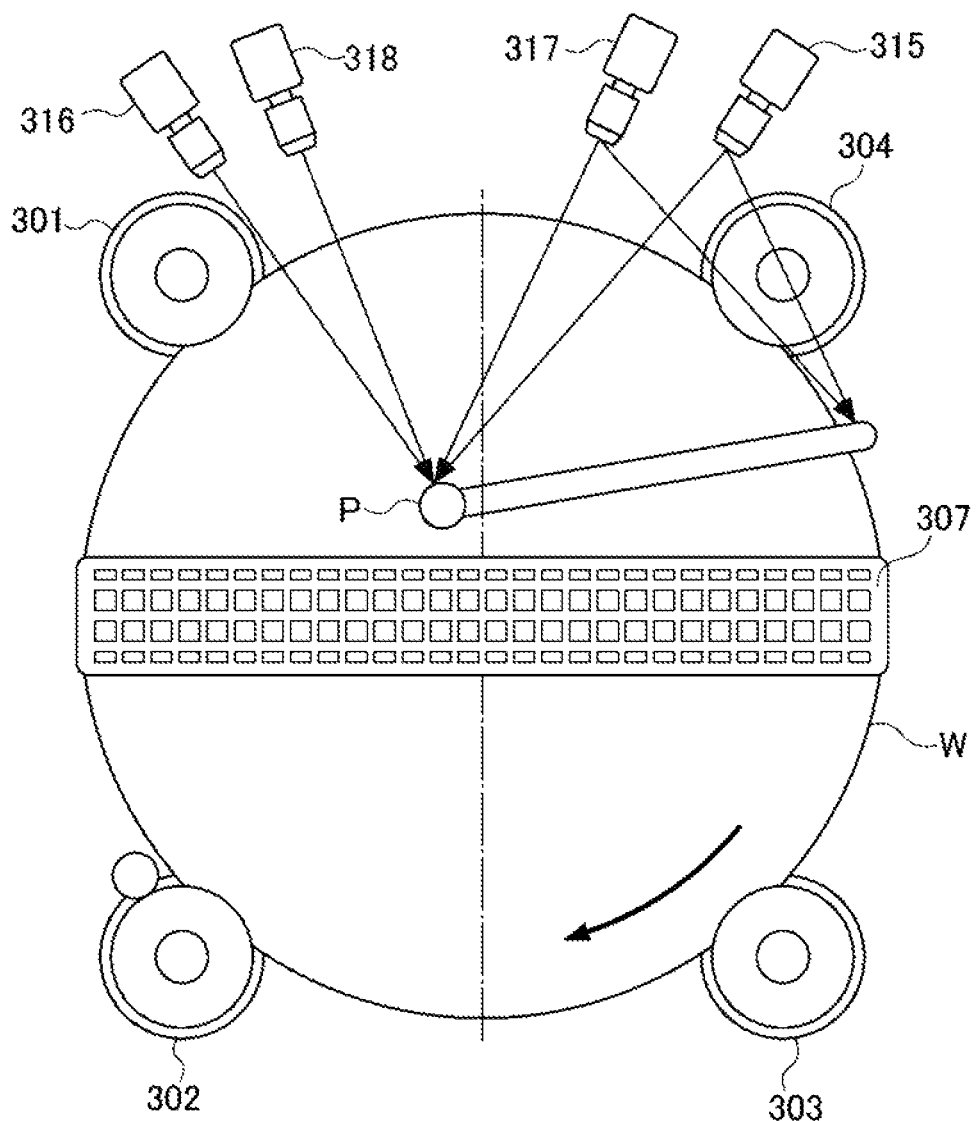
FIG. 5A is a front view of a substrate cleaning apparatus of a modified example.
Figure 5B:
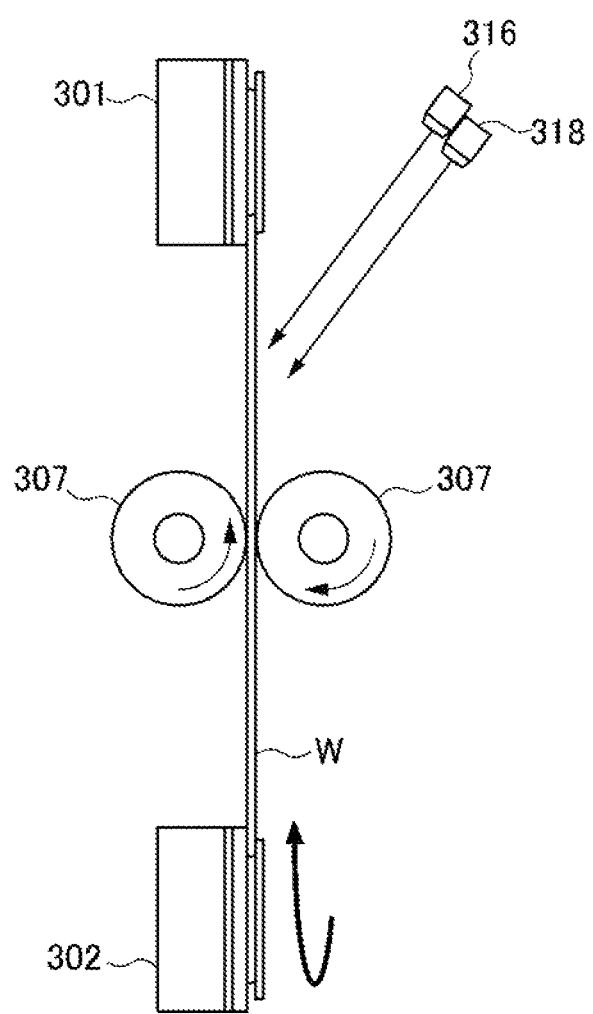
FIG. 5B is a side view of the substrate cleaning apparatus of the modified example.

Instead of holding the substrate W in a horizontal direction, the substrate W may be held in a vertical direction as shown in FIGS. 5A and 5B. When the roll sponge 307 that cleans the front surface of the substrate W rotates clockwise, the roll sponge 308 (see FIG. 5B) that cleans the back surface of the substrate W rotates counterclockwise. Also in the case where the substrate W is held in the vertical direction, the liquids may be supplied from the spray-type nozzles to a large area in a front side (or upper side) of the substrate W, and the liquids may be forcefully supplied from the pin-type nozzles to a small area near the center of the substrate W.

The above embodiment is described so that a person with an ordinary skill in the technical field to which the invention pertains can implement the invention. Various modified examples of the above embodiments can be naturally made by those skilled in the art, and the technical idea of the invention can be applied to other embodiments. Therefore, the invention is not limited to the described embodiment and should encompass the widest range in accordance with the technical ideas defined by the claims.

What is claimed is:

1. A substrate cleaning apparatus comprising:
    a substrate holding and rotating module;
    a rotating mechanism for holding and rotating an elongated cleaning member during cleaning a substrate, the rotating mechanism being configured to make the elongated cleaning member come into contact with the substrate while the substrate is held and rotated by the substrate holding and rotating module; and
    a plurality of pin-type nozzles and a plurality of spray-type nozzles, both of which are arranged at an identical side with respect to a longitudinal direction of the cleaning member and with respect to a first surface of the substrate, and
    wherein the plurality of pin-type nozzles are configured to supply liquid only to a first liquid reaching area on the first surface of the substrate, an entirety of the first liquid reaching area being near a center of the substrate during cleaning the substrate,
    wherein the plurality of spray-type nozzles are configured to supply liquid only to a second liquid reaching area on the first surface of the substrate, the second liquid reaching area extending from a first position near the center of the substrate to a second position near an edge of the substrate, a longitudinal direction of the second liquid reaching area not being parallel to the longitudinal direction of the cleaning member while cleaning the substrate, the second liquid reaching area overlapping the first liquid reaching area at the first position.

2. The substrate cleaning apparatus according to claim 1, wherein the cleaning member is roll type sponge.

3. The substrate cleaning apparatus according to claim 1, wherein
    the plurality of pin-type nozzles and the plurality of spray-type nozzles are disposed such that at least a part of one end of the second liquid reaching area is superposed with at least a part of the first liquid reaching area.

4. The substrate cleaning apparatus according to claim 1, wherein the plurality of pin-type nozzles and the plurality of spray-type nozzles are disposed such that the closer to the edge of the substrate, the farther the second liquid reaching area is away from the cleaning member.

5. The substrate cleaning apparatus according to claim 1, wherein the first liquid reaching area and the second liquid reaching area are located in an area after the rotating substrate comes into contact with the cleaning member.

6. The substrate cleaning apparatus according to claim 1, wherein a direction of a liquid line from the plurality of spray-type nozzles to the substrate is not opposite to a rotation direction of the substrate.

7. The substrate cleaning apparatus according to claim 6, wherein a direction of the liquid line from the plurality of spray-type nozzles to the substrate is coincident with a rotation direction of the cleaning member at a position where the cleaning member and the substrate come into contact with each other.

8. The substrate cleaning apparatus according to claim 1, further includes an attachment, wherein
    each of the plurality of pin-type nozzles is connected to a pipe from a liquid supply source through the attachment, and
    a diameter of a hole of the attachment through which liquid passes is smaller than a diameter of the pipe.

* * * * *